United States Patent
Wada et al.

(10) Patent No.: US 11,120,994 B2
(45) Date of Patent: Sep. 14, 2021

(54) ETCHING SOLUTION, AND METHOD OF PRODUCING SEMICONDUCTOR ELEMENT

(71) Applicant: TOKYO OHKA KOGYO CO., LTD., Kawasaki (JP)

(72) Inventors: Yukihisa Wada, Kawasaki (JP); Mai Sugawara, Kawasaki (JP); Takuya Ohhashi, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 16/725,097

(22) Filed: Dec. 23, 2019

(65) Prior Publication Data

US 2020/0211856 A1 Jul. 2, 2020

(30) Foreign Application Priority Data

Dec. 27, 2018 (JP) .............................. JP2018-244958

(51) Int. Cl.
*H01L 21/306* (2006.01)
*C09K 13/08* (2006.01)

(52) U.S. Cl.
CPC ........ *H01L 21/30612* (2013.01); *C09K 13/08* (2013.01)

(58) Field of Classification Search
None
See application file for complete search history.

(56) References Cited

U.S. PATENT DOCUMENTS

| 5,993,686 A | * | 11/1999 | Streinz ................ H01L 21/3213 |
| | | | 252/79.3 |
| 7,176,041 B2 | | 2/2007 | Lee et al. |
| 10,414,978 B2 | * | 9/2019 | Kim .................. H01L 29/66772 |
| 2002/0111024 A1 | * | 8/2002 | Small .................. H01L 21/3212 |
| | | | 438/689 |
| 2018/0197746 A1 | * | 7/2018 | Bilodeau ................ C09K 13/06 |
| 2019/0103282 A1 | * | 4/2019 | Ge .................... H01L 29/42392 |
| 2019/0276739 A1 | * | 9/2019 | Liu .................. H01L 21/30604 |

FOREIGN PATENT DOCUMENTS

| JP | 2018-519674 A | 7/2018 |
| WO | WO 2017/007893 A1 | 1/2017 |

* cited by examiner

*Primary Examiner* — Shamim Ahmed
(74) *Attorney, Agent, or Firm* — Knobbe Martens Olson & Bear LLP

(57) ABSTRACT

A SiGe compound etching solution for selectively etching a compound represented by general formula $Si_{1-x}Ge_x$ (provided that x is 0 or more and less than 1) relative to Si, Ge and an oxide thereof, the SiGe compound etching solution including periodic acid and fluoride.

4 Claims, No Drawings

ETCHING SOLUTION, AND METHOD OF PRODUCING SEMICONDUCTOR ELEMENT

TECHNICAL FIELD

The present invention relates to an etching solution, and a method of producing a semiconductor element.

Priority is claimed on Japanese Patent Application No. 2018-244958, filed Dec. 27, 2018, the content of which is incorporated herein by reference.

DESCRIPTION OF RELATED ART

Conventionally, scaling of the configuration in an integrated circuit has made it possible to increase the density of functional units on a semiconductor chip. For example, shrinking transistor size allows for the incorporation of an increased number of memory devices on a chip, leading to the fabrication of products with increased capacity.

In the manufacture of field effect transistors (FETs) for integrated circuit devices, Ge is used as a semiconductor crystal material other than silicon. Ge offers a number of potentially advantageous features relative to silicon, such as high charge carrier (hole) mobility, band gap offset, a different lattice constant, and the ability to alloy with silicon to form semiconducting binary alloys of SiGe.

Various etching solutions with high selectivity to Ge materials (in particular, a compound represented by general formula: $Si_{1-x}Ge_x$, wherein x is more than 0 and less than 1; hereafter, sometimes referred to simply as "SiGe compound") have been proposed.

For example, Patent Literature 1 describes an etching composition including at least one diol compound, at least one fluoride species and at least one oxidizing species.

Patent Literature 2 describes an etching composition containing peracetic acid, fluoric acid, and an oxide.

DOCUMENTS OF RELATED ART

Patent Literature

[Patent Literature 1] Japanese Unexamined Patent Application Publication (Translation of PCT Application) No. 2018-519674
[Patent Literature 2] U.S. Pat. No. 7,176,041

SUMMARY OF THE INVENTION

However, the conventional etching solution as described in Patent Document 1 or 2 is chemically unstable, and the etching rate for the SiGe compound may fluctuate with time, which may make it difficult to control the manufacturing process.

The present invention takes the above circumstances into consideration, with an object of providing an etching solution with improved etching rate stability over time for a compound represented by general formula: $Si_{1-x}Ge_x$, a method of treating an object using the etching solution, and a method of producing a semiconductor element.

For solving the above-mentioned problems, the present invention employs the following aspects.

A first aspect of the present invention is a SiGe compound etching solution for selectively etching a compound represented by general formula $Si_{1-x}Ge_x$ (provided that x is 0 or more and less than 1) relative to Si, Ge and an oxide thereof, the SiGe compound etching solution including periodic acid and fluoride.

A second aspect of the present invention is a method of treating an object, the method including subjecting the object to be treated containing a compound represented by general formula $Si_{1-x}Ge_x$ to an etching treatment using the etching solution according to the first aspect.

A third aspect of the present invention is a method of producing a semiconductor element, the method including subjecting an object to be treated containing a compound represented by general formula $Si_{1-x}Ge_x$ to an etching treatment using the etching solution according to the first aspect.

According to the present invention, there are provided an etching solution with improved etching rate stability over time for a compound represented by general formula: $Si_{1-x}Ge_x$, and a method of producing a semiconductor element.

DETAILED DESCRIPTION OF THE INVENTION (Etching Solution)

The etching solution according to a first aspect of the present invention includes periodic acid and fluoride. The etching solution of the present embodiment is used for selectively etching a compound represented by general formula $Si_{1-x}Ge_x$ (hereafter, sometimes referred to simply as "SiGe compound") relative to Si, Ge and an oxide thereof <Periodic Acid>

The etching solution of the present embodiment includes periodic acid. Examples of the periodic acid include orthoperiodic acid ($H_5IO_6$) and metaperiodic acid ($HIO_4$), and orthoperiodic acid ($H_5IO_6$) is preferable.

SiGe compounds may be rendered soluble by oxidation. Periodic acid is an oxidant that releases oxygen atoms to oxidize the SiGe compound, and the redox potential of periodic acid has a potential sufficient to oxidize the SiGe compound. As a result, a SiGe compound may be efficiently oxidized.

The amount of the periodic acid in the etching solution of the present embodiment is not particularly limited. The amount of periodic acid with respect to the total mass of the etching solution is, for example, 0.02 to 5% by mass, preferably 0.05 to 4.5% by mass, more preferably 0.1 to 4% by mass, and still more preferably 0.20 to 3% by mass.

When the amount of periodic acid is within the above-mentioned range, the stability over time of the etching rate with respect to the SiGe compound may be more reliably improved.

<Fluoride>

The etching solution of the present embodiment contains fluoride.

Fluoride species contemplated include, but are not limited to, hexafluorotitanic acid, hexafluorosilicic acid, hexafluorozirconic acid, tetrafluoboric acid, tetrabutylammonium trifluoromethanesulfonate, tetraalkylammonium tetrafluoroborates ($NR_1R_2R_3R_4BF_4$) such as tetrabutylammonium tetrafluoroborate, tetraalkylammonium hexafluorophosphates ($NR_1R_2R_3R_4PF_6$) tetraalkylammonium fluorides ($NR_1R_2R_3R_4F$) (anhydrous or hydrates thereof) such as tetramethylammonium fluoride, ammonium bifluoride, ammonium fluoride, where $R_1$, $R_2$, $R_3$, $R_4$ may be the same as or different from one another and is selected from the group consisting of hydrogen, straight-chained or branched $C_1$-$C_6$ alkyl groups (e.g., methyl, ethyl, propyl, butyl, pentyl, hexyl), $C_1$-$C_6$ alkoxy groups (e.g., hydroxyethyl, hydroxypropyl) substituted or unsubstitued aryl groups (e.g., benzyl).

Among the above examples, as the fluoride, hydrofluoric acid (DHF) and/or ammonium fluoride ($NH_4F$) is preferable.

In the etching of the present embodiment, as the fluoride, one kind of compound may be used, or two or more kinds of compounds may be used in combination.

The amount of the fluoride in the etching solution of the present embodiment is not particularly limited. The amount of fluoride with respect to the total mass of the etching solution is, for example, 0.02 to 5% by mass, preferably 0.025 to 3.00% by mass, more preferably 0.03 to 2.50% by mass, and still more preferably 0.04 to 2.00% by mass. When the amount of fluoride is within the above-mentioned range, the etching rate with respect to the SiGe compound may be more reliably improved.

Further, the fluorine ion concentration of the etching solution of the present embodiment is not particularly limited, but for example, 0.005 to 2.50 mol/L, preferably 0.007 to 1.50 mol/L, more preferably 0.008 to 1.25 mol/L, and still more preferably 0.010 to 1.00 mol/L. When the fluorine ion concentration is within the above-mentioned range, the etching rate with respect to the SiGe compound may be more reliably improved.

<Other Components>

The etching solution of the present embodiment may contain, in addition to the above components, other components as long as the effects of the present invention are not impaired. Examples of other components include water, a water-soluble organic solvent, a pH adjuster, an oxidizing agent, a passivation agent, and a surfactant.

Water

The etching solution of the present embodiment preferably contains water as a solvent for the above components. The water may contain trace components that are inevitably mixed. The water used in the etching solution of the present embodiment is preferably water that has been subjected to purification treatment, such as distilled water, ion-exchanged water, and ultrapure water, more preferably ultrapure water that is generally used in semiconductor manufacturing.

The amount of water in the etching solution of the present embodiment is not particularly limited, and is preferably 80% by mass or more, more preferably 90% by mass or more, and still more preferably 94% by mass or more. The upper limit is not particularly limited, but is preferably less than 99.95% by mass, more preferably 99.9% by mass, and still more preferably 99.5% by mass. The etching solution of the present embodiment is preferably an aqueous solution containing periodic acid and fluoride.

Water-Soluble Organic Solvent

The etching solution of the present embodiment may contain a water-soluble organic solvent, as long as the effects of the present invention are not impaired. Examples of the water-soluble organic solvent include alcohols (such as methanol, ethanol, ethylene glycol, propylene glycol, glycerin, 1,3-propanediol, 1,3-butanediol, 1,4-butanediol, diethylene glycol, dipropylene glycol, furfuryl alcohol, and 2-methyl-2,4-pentanediol), dimethyl sulfoxide, and ethers (such as ethylene glycol dimethyl ether, diethylene glycol dimethyl ether, triethylene glycol dimethyl ether, tetraethylene glycol dimethyl ether, propylene glycol dimethyl ether).

In the etching of the present embodiment, as the water-soluble organic solvent, one kind of compound may be used, or two or more kinds of compounds may be used in combination.

When the etching solution of the present embodiment contains water-soluble organic solvent, the amount of the water-soluble organic solvent, relative to the total amount of water and the water-soluble organic solvent is preferably 50% by mass or less, more preferably 30% by mass or less, and still more preferably 10% by mass or less.

pH Adjuster

For further improving the etching rate with respect to the SiGe compound, the etching solution of the present embodiment may contain a pH adjuster.

As the pH adjuster, at least one member selected from the group consisting of acids and salts thereof is preferable. Specifically examples thereof include methanesulfonic acid, trifluoromethanesulfonic acid, oxalic acid dihydrate, citric acid, tartaric acid, picolinic acid, succinic acid, acetic acid, lactic acid, sulfosuccinic acid, benzoic acid, propionic acid, formic acid, pyruvic acid, maleic acid, malonic acid, fumaric acid, malic acid, ascorbic acid, mandelic acid, heptanoic acid, butyric acid, valeric acid, glutaric acid, phthalic acid, hypophosphorous acid, salicylic acid, 5-sulfosalicylic acid, hydrochloric acid, ethanesulfonic acid, butanesulfonic acid, p-toluenesulfonic acid, dichloroacetic acid, difluoroacetic acid, monochloroacetic acid, monofluoroacetic acid, trichloroacetic acid, trifluoroacetic acid, hydrobromic acid (62% by weight), sulfuric acid, ammonium acetate, sodium acetate, potassium acetate, tetramethylammonium acetate and other tetraalkylammonium acetates, phosphonium acetate, ammonium butyrate, ammonium trifluoroacetate, ammonium carbonate, ammonium chloride, ammonium sulfate, phosphoric acid, diammonium hydrogen phosphate, ammonium dihydrogen phosphate, bis(tetramethylammonium) hydrogen phosphate, disodium hydrogen phosphate, phosphorus sodium dihydrogen phosphate, dipotassium hydrogen phosphate, potassium dihydrogen phosphate, ditetraalkyl ammonium hydrogen phosphate, ditetraalkyl ammonium dihydrogen phosphate, diphosphonium hydrogen phosphate, phosphonium dihydrogen phosphate, ammonium phosphonate, tetraalkylammonium phosphonate, sodium phosphonate, potassium phosphonate, phosphonium phosphonate, etidronic acid, and salts thereof.

Among the above examples, as the acid for the pH adjuster, methanesulfonic acid or oxalic acid is preferable.

The etching solution of the present embodiment may contain, as a pH adjuster, a basic compound. As such basic compounds, organic alkaline compounds and inorganic alkaline compounds can be used. Preferable examples of organic alkaline compounds include quaternary ammonium salts including organic quaternary ammonium hydroxides, and alkylamines and derivatives thereof, such as trimethylamine and triethylamine.

Examples of the inorganic alkaline compound include inorganic compounds containing alkali metals or alkaline earth metals and salts thereof. Examples thereof include lithium hydroxide, sodium hydroxide, potassium hydroxide, rubidium hydroxide and cesium hydroxide.

In the etching of the present embodiment, as the pH adjuster, one kind of compound may be used, or two or more kinds of compounds may be used in combination.

When the etching solution of the present embodiment contains a pH adjuster, the amount of the pH adjuster with respect to the total mass of the etching solution is, for example, 0.01 to 10% by mass, preferably 0.02 to 4.5% by mass, more preferably 0.03 to 4% by mass, and still more preferably 0.05 to 3% by mass. When the amount of the pH adjuster is within the above-mentioned range, the etching rate with respect to the SiGe compound may be more reliably improved.

Oxidizing Agent

The etching solution of the present embodiment may contain, in addition to periodic acid, any other oxidizing agent.

Examples of the oxidizing agent include hydrogen peroxide, $FeCl_3$, $FeF_3$, $Fe(NO_3)_3$, $Sr(NO_3)_2$, $CoF_3$, $MnF_3$, Oxone ($2KHSO_5 \cdot KHSO_4 \cdot K_2SO_4$), iodic acid, vanadium oxide (V), vanadium oxide (IV, V), ammonium vanadate, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium manganate, potassium persulfate, nitric acid, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea peroxide, peracetic acid, methyl-1,4-Benzoquinone (MBQ), 1,4-benzoquinone (BQ), 1,2-benzoquinone, 2,6-dichloro-1,4-benzoquinone (DCBQ), tolquinone, 2,6-dimethyl-1,4-benzoquinone (DMBQ), chloranil, alloxan, N-methylmorpholine N-oxide, and trimethylamine N-oxide.

In the etching of the present embodiment, as the oxidizing agent, one kind of compound may be used, or two or more kinds of compounds may be used in combination.

When the etching solution of the present embodiment contains an oxidizing agent, the amount of the oxidizing agent with respect to the total mass of the etching solution is preferably 0.01 to 10% by mass, more preferably 0.1 to 7% by mass.

Passivation Agent

The etching solution of the present embodiment may contain a passivation agent for germanium.

Examples of the passivation agent include ascorbic acid, L (+)-ascorbic acid, isoascorbic acid, ascorbic acid derivatives, boric acid, ammonium diborate, borates (eg, ammonium pentaborate, sodium tetraborate and dibora Acid ammonium), alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, sodium bromide, potassium bromide, Rubidium bromide, magnesium bromide, calcium bromide, and ammonium bromide represented by the formula $NR^1R^2R^3R^4Br$ (in the formula, $R^1$, $R^2$, $R^3$ and $R^4$ may be the same as or different from each other, and selected from the group consisting of hydrogen, and branched or straight-chain $C_1$-$C_6$alkyl (such as methyl, ethyl, propyl, butyl, pentyl, and hexyl).

In the etching of the present embodiment, as the passivation agent, one kind of compound may be used, or two or more kinds of compounds may be used in combination.

When the etching solution of the present embodiment contains a passivation agent, the amount of the passivation agent with respect to the total mass of the etching solution is preferably 0.01 to 5% by mass, more preferably 0.1 to 1% by mass.

Surfactant

The etching solution of the present embodiment may contain a surfactant for the purpose of adjusting the wettability of the etching solution with respect to the target object (object to be treated). As the surfactant, a nonionic surfactant, an anionic surfactant, a cationic surfactant, or an amphoteric surfactant may be used, and these may be used in combination.

Examples of nonionic surfactants include polyalkylene oxide alkylphenyl ether surfactants, polyalkylene oxide alkyl ether surfactants, block polymer surfactants composed of polyethylene oxide and polypropylene oxide, and polyoxyalkylene distyrenated phenyl ether surfactants, polyalkylene tribenzylphenyl ether surfactants, and acetylene polyalkylene oxide surfactants.

Examples of the anionic surfactant include alkyl sulfonic acid, alkyl benzene sulfonic acid, alkyl naphthalene sulfonic acid, alkyl diphenyl ether sulfonic acid, fatty acid amide sulfonic acid, polyoxyethylene alkyl ether carboxylic acid, polyoxyethylene alkyl ether acetic acid, polyoxyethylene alkyl ether propionic acid, alkyl phosphonic acid, and fatty acid salt. Examples of the "salt" include ammonium salt, sodium salt, potassium salt, tetramethylammonium salt and the like.

Examples of the cationic surfactant include a quaternary ammonium salt surfactant, and an alkyl pyridium surfactant.

Examples of amphoteric surfactants include betaine surfactants, amino acid surfactants, imidazoline surfactants, and amine oxide surfactants.

The above surfactants are generally commercially available. As the surfactant, one kind of compound may be used alone, or two or more kinds of compounds may be used in combination.

<Object to be Treated>

The etching solution of the present embodiment is used for SiGe compound etching, and an object to be treated including SiGe compound is the target of the etching processing. The object to be treated is not particularly limited as long as the object includes SiGe compound and examples thereof include a substrate having a SiGe compound-containing layer (SiGe compound-containing film) or the like. The substrate is not particularly limited and examples thereof include various substrates such as a semiconductor wafer, a glass substrate for a photomask, a glass substrate for a liquid crystal display, a glass substrate for a plasma display, a substrate for a field emission display (FED), a substrate for an optical disk, a substrate for a magnetic disk, and substrate for a magneto-optical disk. As the substrate, a substrate used for semiconductor device production is preferable. In addition to the SiGe compound-containing layer and the base material of the substrate, the substrate may have various layers and structures as appropriate, such as, for example, metal wiring, a gate structure, a source structure, a drain structure, an insulating layer, a ferromagnetic layer, a nonmagnetic layer, and the like. In addition, the uppermost layer on the device surface of the substrate does not need to be the SiGe compound-containing layer and, for example, the intermediate layer of the multilayer structure may be the SiGe compound-containing layer.

The size, thickness, shape, layer structure, and the like of the substrate are not particularly limited and may be appropriately selected depending on the purpose.

The SiGe compound-containing layer is preferably a layer containing a SiGe compound, and more preferably a SiGe compound film. The thickness of the SiGe compound-containing layer on the substrate is not particularly limited, and may be appropriately selected depending on the purpose. Examples of the thickness of the SiGe compound-containing layer include a range of 1 to 500 nm and 1 to 300 nm.

The etching solution of the present embodiment may be used for performing fine processing of the SiGe compound-containing layer in the substrate, may be used for removing SiGe compound-containing deposits attached to the substrate, and may be used to remove impurities such as particles from the object to be treated having the SiGe compound-containing layer on the surface.

According to the etching solution of the present embodiment described above, since periodic acid is included as the oxidizing agent, it is possible to improve the stability of the etching rate over time with respect to the SiGe compound. The reason has not been elucidated yet, since periodic acid is very stable as an oxidizing agent, but this is presumed that the etching solution of the present embodiment does not exhibit deteriorated etching rate over time with respect to SiGe compound. For example, the etching rate with respect to SiGe compound hardly changes even after the etching solution of the present embodiment is stored at room temperature for 3 days or more or 7 days or more. Therefore, it is presumed that a manufacturing process including an etching process of SiGe compound may be stably controlled by the etching solution of the present embodiment.

(Method of Treating Object)

A second aspect of the present invention is a method of treating an object, the method including subjecting the object to be treated containing a SiGe compound to an etching treatment using the etching solution according to the first aspect.

The object to be treated containing a SiGe compound is the same as defined for the "object to be treated" described above for the etching solution, and preferable examples thereof include a substrate having a SiGe compound-containing layer. The method for forming the ruthenium-containing layer on the substrate is not particularly limited and it is possible to use known methods. Examples of such methods include a sputtering method, a chemical vapor deposition (CVD) method, a molecular beam epitaxy (MBE) method, an atomic layer deposition (ALD) method, and the like. The raw material of the ruthenium-containing layer used when forming the ruthenium-containing layer on the substrate is not particularly limited, and appropriate selection thereof is possible according to the film forming method.

<Step of Subjecting Object to Etching Treatment>

This step is a step of carrying out an etching process on the object to be treated containing a SiGe compound, using the etching solution according to the first aspect, and includes an operation of bringing the etching solution into contact with the object to be treated. The etching treatment method is not particularly limited and it is possible to use a known etching method. Examples of such methods include a spray method, an immersion method, a liquid filling method, or the like, without being limited thereto.

In the spray method, for example, the object to be treated is transported or rotated in a predetermined direction, the etching solution according to the first aspect is sprayed into the space such that the etching solution is brought into contact with the object to be treated. If desired, the etching solution may be sprayed while rotating the substrate using a spin coater.

In the immersion method, the object to be treated is immersed in the etching solution according to the first aspect and the etching solution is brought into contact with the object to be treated.

In the liquid filling method, the etching solution according to the first aspect is placed on the object to be treated and the object to be treated and the etching solution are brought into contact with each other.

It is possible to appropriately select these etching process methods depending on the structure, materials, and the like of the object to be treated. In a case of the spray method or the liquid filling method, it is sufficient if the supply amount of the etching solution to the object to be treated is an amount by which the surface to be treated in the object to be treated is sufficiently wetted by the etching solution.

The purpose of the etching treatment is not particularly limited and may be fine processing for a surface to be treated of the object to be treated containing SiGe compound (for example, a SiGe compound-containing layer on a substrate), may be removal of a SiGe compound-containing deposit attached to the object to be treated (for example, a substrate having a SiGe compound-containing layer), or may be cleaning of a surface to be treated of the object to be treated containing SiGe compound (for example, a SiGe compound-containing layer on the substrate).

In a case where the purpose of the etching treatment is fine processing of the surface to be treated of the object to be treated including SiGe compound, generally, the portion not to be etched is covered with an etching mask and the object to be treated and the etching solution are brought into contact with each other.

In a case where the purpose of the etching treatment is the removal of SiGe compound-containing deposits attached to the object to be treated, the SiGe compound-containing deposits are dissolved by bringing the etching solution according to the first aspect into contact with the object to be treated and it is possible to remove the SiGe compound deposits from the object to be treated.

In a case where the purpose of the etching treatment is to clean the surface to be treated of the object to be treated including ruthenium, the surface to be treated is rapidly dissolved by bringing the etching solution according to the first aspect into contact with the object to be treated and impurities such as particles attached to the surface of the object to be treated are removed from the surface of the object to be treated in a short time.

The temperature at which the etching treatment is performed is not particularly limited as long as the SiGe compound is dissolved with the etching solution. Examples of the temperature for the etching process include 15° C. to 60° C. In a case of any of the spray method, the immersion method, and the liquid filling method, the etching rate is increased by increasing the temperature of the etching solution, but it is possible to appropriately select the processing temperature in consideration of suppressing composition changes in the etching solution to be small, or workability, safety, cost, and the like.

The time for performing the etching treatment may be appropriately selected according to the purpose of the etching treatment, the amount of SiGe compound to be removed by the etching (for example, the thickness of the SiGe compound-containing layer, the amount of SiGe compound deposits, and the like) and the etching treatment conditions.

According to the method of treating an object of the present embodiment described above, the object to be treated is etched using the etching solution according to the first aspect containing periodic acid as an oxidizing agent. Since the etching solution exhibits highly stable etching rate with respect to the SiGe compound over time, a manufacturing process including an etching step of the SiGe compound may be stably controlled.

(Method of Producing Semiconductor Element)

A third aspect of the present invention is a method of producing a semiconductor element, the method including subjecting an object to be treated containing a SiGe compound to an etching treatment using the etching solution according to the first aspect.

It is possible to perform the step of carrying out an etching treatment on the object to be treatment including SiGe compound in the same manner as the method illustrated in the "Method of treating object" described above. The object to be treated including SiGe compound is preferably a substrate having a SiGe compound-containing layer. As the substrate, it is possible to use a substrate generally used for semiconductor element production.

<Other Steps>

The method of producing a semiconductor element according to the present embodiment may include other steps in addition to the etching treatment step described above. The other steps are not particularly limited and examples thereof include known steps performed when manufacturing a semiconductor element. Examples of the steps include a step for forming each structure such as a metal wiring, a gate structure, a source structure, a drain structure, an insulating layer, a ferromagnetic layer, and a nonmagnetic layer (layer formation, etching other than the etching process described above, chemical mechanical polishing, modification, and the like), a resist film formation step, an exposure step, a development step, a heating process step, a cleaning step, an inspection step, and the like, without being limited thereto. It is possible to appropriately perform these other steps before or after the etching process step if desired.

According to the method of producing a semiconductor element of the present embodiment described above, an etching treatment for an object to be treated is performed using an etching solution according to the first aspect described above including periodic acid as an oxidizing agent.

Since the etching solution exhibits highly stable etching rate with respect to the SiGe compound over time, a manufacturing process including an etching step of the SiGe compound may be stably controlled.

EXAMPLES

As follows is a description of examples of the present invention, although the scope of the present invention is by no way limited by these examples.

Preparation of Etching Solution

Examples 1 to 4, Comparative Examples 1 to 3

The components shown in Table 1 were mixed together to obtain each etching solution.

TABLE 1

|  | Solvent | Fluoride | Oxidizing agent | pH adjuster |
|---|---|---|---|---|
| Comparative Example1 | Water [99.9%] | DHF [0.1%] | — | — |
| Comparative Example2 | Water [98.4%] | DHF [0.1%] | PAA [1.5%] | — |
| Comparative Example3 | Water [98.4%] | NH$_4$F [0.1%] | PAA [1.5%] | — |
| Example1 | Water [98.4%] | DHF [0.1%] | PIA [1.5%] | — |
| Example2 | Water [98.4%] | NH$_4$F [0.1%] | PIA [1.5%] | — |
| Example3 | Water [97.4%] | NH$_4$F [0.1%] | PIA [1.5%] | AA [1%] |
| Example4 | Water [97.4%] | NH$_4$F [0.1%] | PIA [1.5%] | MSA [1%] |

In Table 1, the reference characters indicate the following. The values in brackets [ ] indicate the amount (in terms of parts by mass) of the component added.

DHF: hydrofluoric acid

NH$_4$F: ammonium fluoride

PAA: peracetic acid

PIA: periodic acid (H$_5$IO$_6$)

AA: acetic acid

MSA: methanesulfonic acid

<Etching Treatment of Object (1)>

A SiGe film was epitaxially grown on a silicon substrate to obtain an object to be treated (1) on which the SiGe film was formed. A test piece was cut out from the obtained object (1) and the film thickness of the SiGe film was measured by fluorescent X-ray analysis. As a result, it was found that the film thickness was 50 nm.

The etching solution of each example was put into a beaker, and an etching treatment was performed by immersing the test piece in the etching solution of each example for 5 minutes at room temperature (23° C.). After the etching treatment, the test piece was dried by nitrogen blowing, and the thickness of the SiGe film was measured by fluorescent X-ray analysis. The etching rate (Å/min) with respect to SiGe was calculated from the film thickness of the SiGe film before and after the etching treatment. The results are shown in Table 2.

<Etching Treatment of Object (2)>

A test piece was cut from a SOI (100) substrate to obtain an object to be treated (2). The film thickness of the Si film on the obtained object (2) was measured by spectroscopic ellipsometry. As a result, it was found that the film thickness was 100 nm.

The etching solution of each example was put into a beaker, and an etching treatment was performed by immersing the test piece in the etching solution of each example for 5 minutes at room temperature (23° C.). After the etching treatment, the test piece was dried by nitrogen blowing, and the thickness of the Si film was measured by spectroscopic ellipsometry. The etching rate (Å/min) with respect to Si was calculated from the film thickness of the Si film before and after the etching treatment. The results are shown in Table 2.

<Etching Treatment of Object (3)>

A silicon oxide film was formed on the silicon substrate by chemical vapor deposition (CVD) to obtain an object to be treated (3). A test piece was cut out from the obtained object (3) and the thickness of the silicon oxide film was measured by spectroscopic ellipsometry. As a result, it was found that the thickness was 100 nm.

The etching solution of each example was put into a beaker, and an etching treatment was performed by immersing the test piece in the etching solution of each example for 5 minutes at room temperature (23° C.). After the etching treatment, the test piece was dried by nitrogen blowing, and the thickness of the silicon oxide film was measured by spectroscopic ellipsometry. The etching rate (Å/min) with respect to Si was calculated from the thickness of the silicon oxide film before and after the etching treatment. The results are shown in Table 2.

<Evaluation of Etching Selectivity>

Based on the results of the etching rate obtained in "Etching treatment of object (1)", "Etching treatment of object (2)" and Etching treatment of object (3), the etching selectivity ratio of object (1)/object (2) and the etching selectivity ratio of object (1)/object (3) were calculated. The results are shown in Table 2.

TABLE 2

| | Etching rate (Å/min) | | | Etching selectivity ratio | |
|---|---|---|---|---|---|
| | Object (1) | Object (2) | Object (3) | Object (1)/ Object (2) | Object (1)/ Object (3) |
| Comparative Example1 | <1 | <1 | <1 | — | — |
| Comparative Example2 | 27.6 | 3.7 | 11.5 | 7.5 | 2.4 |
| Comparative Example3 | 16.7 | 0.9 | 2.6 | 17.8 | 6.4 |
| Example1 | 36.5 | 4.8 | 12.2 | 7.6 | 3.0 |
| Example2 | 17.0 | 1.0 | 2.7 | 17.0 | 6.3 |
| Example3 | 17.5 | 0.8 | 6.0 | 21.9 | 2.9 |
| Example4 | 13.0 | 0.3 | 1.4 | 46.5 | 9.6 |

From the results shown in Table 2, it was confirmed that the etching solutions of Examples 1 to 4 exhibited about the same level of SiGe etching selectivity ratio as the etching solutions of Comparative Examples 1 to 3.

In particular, the etching solutions of Examples 3 and 4 containing a pH adjuster exhibited improved SiGe etching selectivity ratio, as compared to the etching solutions of Comparative Examples 1 to 3.

<Evaluation of Stability of SiGe Etching Rate Over Time>

The etching solution of Example 2 and the etching solution of Comparative Example 3 were each stored in a bottle, and for each etching solution 3 days after the start of storage, the etching rate ER3 (Å/min) with respect to SiGe was calculated in the same manner as in the above "Etching treatment of the object (1)".

Further, for each etching solution 7 days after the start of storage, the etching rate ER7 (Å/min) with respect to SiGe was calculated in the same manner as in the above "Etching treatment of the object (1)".

The etching rate obtained in the above "Etching treatment of the object (1)" was defined as the etching rate ER0 with respect to SiGe of the etching solution 0 days after start of storage.

For each of the etching rate ER3 and the etching rate ER7, the variation rate (%) from the etching rate ER0 was calculated. The results are shown in Table 3.

TABLE 3

| Comparative Example 3 | | Example 2 | |
|---|---|---|---|
| Etching rate (Å/min) | Variation ratio (%) | Etching rate (Å/min) | Variation ratio (%) |
| ER0 16.7 | 100.0 | ER0 17.0 | 100.0 |
| ER3 11.1 | 66.7 | ER3 17.0 | 100.0 |
| ER7 7.7 | 45.8 | ER7 16.9 | 99.4 |

As seen from the results shown in Table 3, it was confirmed that the etching solution of Example 2 hardly varied in the etching rate with respect to SiGe even after storing for 7 days.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a semiconductor element, the method comprising:
    subjecting a substrate containing a compound represented by general formula $Si_{1-x}Ge_x$ wherein x is 0 or more and less than 1 to an etching treatment using an etching solution to selectively etch the compound represented by general formula $Si_{1-x}Ge_x$ relative to Si, Ge and an oxide thereof, wherein the etching solution consists of:
    water;
    periodic acid; and
    fluoride,
    wherein the amount of water in the etching solution is 94% by mass or more, and the amount of periodic acid in the etching solution is 0.20 to 5% by mass.

2. A method of producing a semiconductor element, the method comprising:
    subjecting a substrate containing a compound represented by general formula $Si_{1-x}Ge_x$ wherein x is 0 or more and less than 1 to an etching treatment using an etching solution to selectively etch the compound represented by general formula $Si_{1-x}Ge_x$ relative to Si, Ge and an oxide thereof, wherein the etching solution consists of:
    water;
    periodic acid;
    fluoride; and
    a pH adjuster selected from the group consisting of methanesulfonic acid, trifluoromethanesulfonic acid, oxalic acid dihydrate, citric acid, tartaric acid, picolinic acid, succinic acid, acetic acid, lactic acid, sulfosuccinic acid, benzoic acid, propionic acid, formic acid, pyruvic acid, maleic acid, malonic acid, fumaric acid, malic acid, ascorbic acid, mandelic acid, heptanoic acid, butyric acid, valeric acid, glutaric acid, phthalic acid, hypophosphorous acid, salicylic acid, 5-sulfosalicylic acid, hydrochloric acid, ethanesulfonic acid, butanesulfonic acid, p-toluenesulfonic acid, dichloroacetic acid, difluoroacetic acid, monochloroacetic acid, monofluoroacetic acid, trichloroacetic acid, trifluoroacetic acid, hydrobromic acid (62% by weight) and sulfuric acid, wherein the amount of water in the etching solution is 94% by mass or more, and the amount of periodic acid in the etching solution is 0.20 to 5% by mass.

3. The method of producing a semiconductor element according to claim 2, wherein the amount of the fluoride in the etching solution is between 0.005 and 2.50 mol/L.

4. The method of producing a semiconductor element according to claim 2, wherein the substrate has a multilayer structure in which an intermediate layer is SiGe compound-containing layer.

* * * * *